(12) United States Patent
Hung et al.

(10) Patent No.: US 9,773,770 B2
(45) Date of Patent: Sep. 26, 2017

(54) SEMICONDUCTOR DEVICE

(71) Applicant: UBIQ Semiconductor Corp., Hsinchu County (TW)

(72) Inventors: Kei-Kang Hung, Hsinchu County (TW); Chih-Hao Chen, Hsinchu County (TW)

(73) Assignee: UBIQ Semiconductor Corp., Hsinchu County (TW)

( * ) Notice: Subject to any disclaimer, the term of this patent is extended or adjusted under 35 U.S.C. 154(b) by 0 days.

(21) Appl. No.: 14/864,903

(22) Filed: Sep. 25, 2015

(65) Prior Publication Data

US 2016/0284692 A1 Sep. 29, 2016

(30) Foreign Application Priority Data

Mar. 27, 2015 (TW) .............................. 104109986 A

(51) Int. Cl.
*H01L 29/74* (2006.01)
*H01L 27/02* (2006.01)
*H01L 27/08* (2006.01)
*H01L 27/092* (2006.01)

(52) U.S. Cl.
CPC ...... *H01L 27/0207* (2013.01); *H01L 27/0814* (2013.01); *H01L 27/092* (2013.01)

(58) Field of Classification Search
CPC ........... H01L 29/7808; H01L 27/11273; H01L 29/7802; H01L 257/331; H01L 257/356; H01L 257/551
USPC ................................. 257/328, 356, 551, 127
See application file for complete search history.

(56) References Cited

U.S. PATENT DOCUMENTS

| 6,580,121 | B2 | 6/2003 | Hisamoto |
| 7,566,914 | B2* | 7/2009 | Salcedo .................. H01L 29/87 257/127 |
| 7,902,604 | B2 | 3/2011 | Su et al. |
| 8,802,509 | B2 | 8/2014 | Su et al. |
| 2013/0248979 | A1* | 9/2013 | Ono .................... H01L 29/7395 257/329 |

* cited by examiner

*Primary Examiner* — Sonya D McCall Shepard
(74) *Attorney, Agent, or Firm* — Jianq Chyun IP Office

(57) ABSTRACT

A semiconductor device includes a semiconductor substrate and a first semiconductor element. The semiconductor substrate has a circuit core area. The first semiconductor element is arranged on the semiconductor substrate and at least partially surrounds the periphery of the circuit core area. A layout area of the first semiconductor element is larger than a layout area of any of the semiconductor elements in the circuit core area.

15 Claims, 10 Drawing Sheets

SEMICONDUCTOR DEVICE

CROSS-REFERENCE TO RELATED APPLICATION

This application claims the priority benefit of Taiwan application serial no. 104109986, filed on Mar. 27, 2015. The entirety of the above-mentioned patent application is hereby incorporated by reference herein and made a part of this specification.

BACKGROUND OF THE INVENTION

Field of the Invention

The invention relates to a semiconductor device, and particularly to a layout structure of a semiconductor device.

Description of Related Art

Large-current semiconductor devices in integrated circuits often occupy significant areas in core circuit. For instance, in an electrostatic discharge (ESD) protection circuit, an ESD clamp is required to occupy a significant area in the core circuit, so as to instantaneously transmit a great amount of transient current (i.e., ESD current). Another example is the output stage of a power integrated circuit (power IC). Since the output stage of the power IC is required to instantaneously provide a great amount of current to a load circuit, the power transistor of the output stage needs to occupy a significant area in the core circuit.

SUMMARY OF THE INVENTION

The invention provides a semiconductor device capable of reducing die size.

In an embodiment of the invention, a semiconductor device that includes a semiconductor substrate and a first semiconductor element is provided. The semiconductor substrate has a circuit core area. The first semiconductor element is arranged on the semiconductor substrate and at least partially surrounds a periphery of the circuit core area. A layout area of the first semiconductor element is larger than a layout area of any of semiconductor elements in the circuit core area.

In view of the above, the semiconductor element occupying the largest area is arranged on the periphery of the circuit core area in the semiconductor device described in an embodiment of the invention, such that the semiconductor element occupying the largest area surrounds the circuit core area (e.g., the core circuit); thereby, the die size can be effectively reduced, and a significant amount of current can be instantaneously and effectively transmitted.

Several exemplary embodiments accompanied with figures are described in detail below to further describe the invention in details.

DETAILED DESCRIPTION OF DISCLOSED EMBODIMENTS

Figure 1:
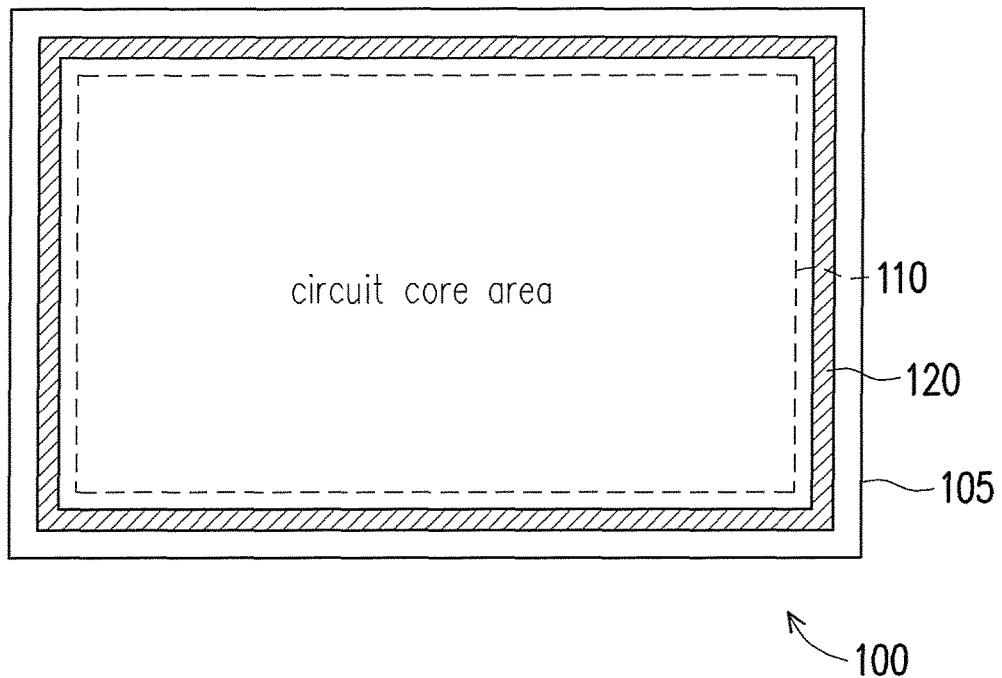
FIG. 1 is a schematic top view illustrating a layout of a semiconductor device according to an embodiment of the invention.

The word "couple" in the description and claims may refer to any direct or indirect connection. For instance, in the description and claims, if a first device is coupled to a second device, it means that the first device may be directly connected to the second device or may be indirectly connected to the second device through another device or by another connection means. Moreover, elements/components/steps with same reference numbers represent the same or similar parts in the drawings and embodiments. The descriptions of the same elements/components/steps in an embodiment of the invention may be applied to the descriptions of the same elements/components/steps in another embodiment.

FIG. 1 is a schematic top view illustrating a layout of a semiconductor device 100 according to an embodiment of the invention. The semiconductor device 100 includes a semiconductor substrate 105, a circuit core area 110, and a first semiconductor element 120. The circuit core area 110 and the first semiconductor element 120 are arranged on the semiconductor substrate 105. The first semiconductor element 120 at least partially surrounds the periphery of the circuit core area 110. The circuit core area 110 has a plurality of semiconductor elements (not shown). A layout area of the first semiconductor element 120 is larger than a layout area of any of the semiconductor elements in the circuit core area 110. For instance, the layout area of the first semiconductor element 120 is at least twice the layout area of any of the semiconductor elements in the circuit core area 110; however, the invention is not limited thereto.

Although the first semiconductor element 120 shown in FIG. 1 is shaped as a ring and surrounds the periphery of the circuit core area 110, the layout of the first semiconductor element 120 is not limited thereto. In some embodiments, the first semiconductor element 120 may be shaped as a letter C or may have another shape, and the first semiconductor element 120 at least partially surrounds the periphery of the circuit core area 110.

According to some embodiments of the invention, the first semiconductor element 120 may be a Zener diode, a power transistor, or any other semiconductor element capable of transmitting a significant amount of transient current. However, the invention is not limited thereto. In the semiconductor device 100 provided in the present embodiment, the first semiconductor element 120 occupying the largest area is arranged on the periphery of the circuit core area 110 rather than in the circuit core area 110. The first semiconductor element 120 surrounds the circuit core area 110 (e.g., the core circuit); therefore, the die size can be effectively reduced, and a significant amount of current can be instantaneously and effectively transmitted. The increase in the circuit core area 110 leads to the improvement of the current transmission capability of the first semiconductor element 120.

Figure 2A:
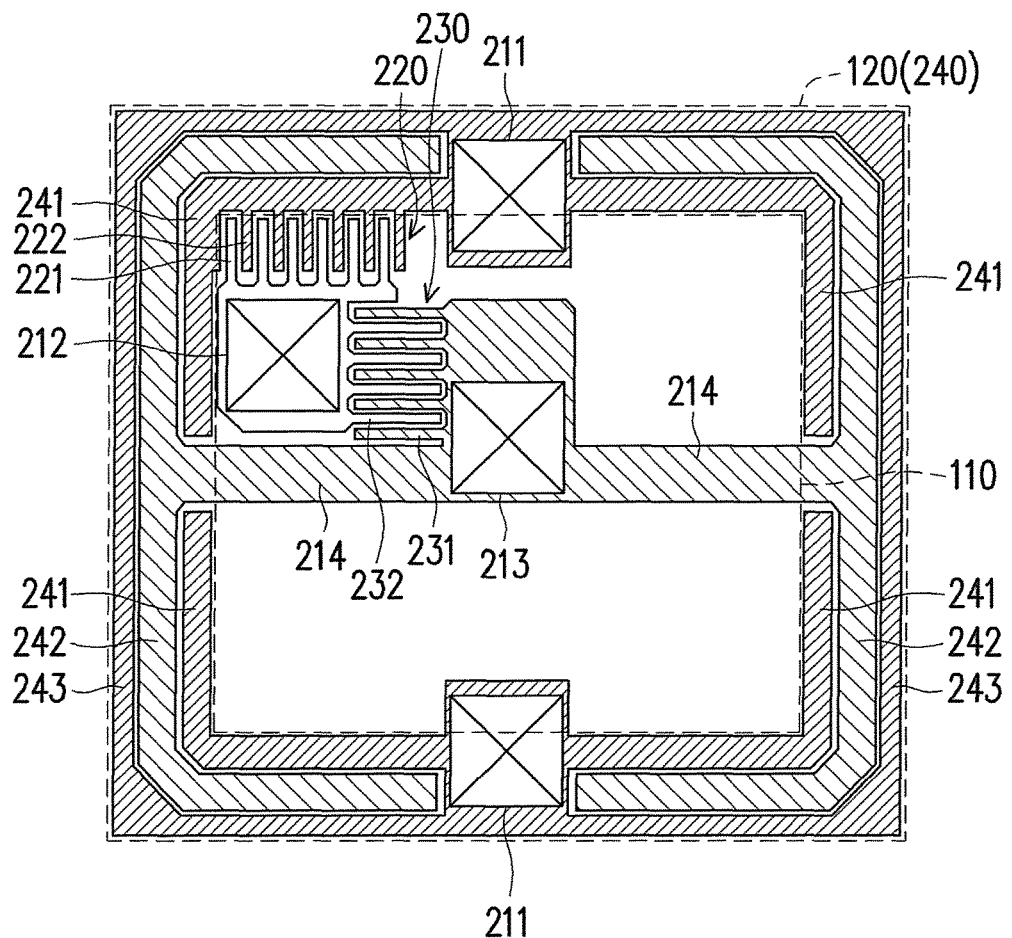
FIG. 2A is a schematic diagram illustrating a circuitry layout of the semiconductor device according to an embodiment of the invention, and the semiconductor device is shown in FIG. 1.
Figure 2B:
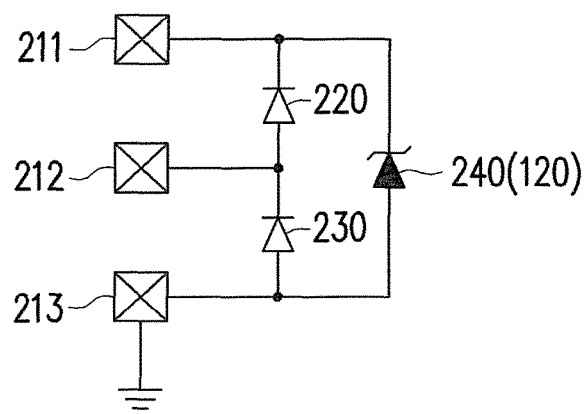
FIG. 2B is a schematic equivalent circuit diagram illustrating the semiconductor device depicted in FIG. 2A.

FIG. 2A is a schematic diagram illustrating a circuitry layout of the semiconductor device 100 according to an embodiment of the invention, and the semiconductor device is shown in FIG. 1. FIG. 2B is a schematic equivalent circuit diagram illustrating the semiconductor device 100 depicted in FIG. 2A. According to an embodiment of the invention, the semiconductor device 100 shown in FIG. 2B can serve as a transient voltage suppressor (TVS) which can be made by performing a complementary metal-oxide semiconductor (CMOS) high voltage manufacturing process or another manufacturing process. Here, the transistor structure of the TVS can be a bipolar semiconductor structure or any other structure. According to another embodiment of the invention, the semiconductor device 100 can also be an electrostatic discharge (ESD) protection circuit, and the invention is not limited thereto.

With reference to FIG. 2A and FIG. 2B, a power pad 211, a signal pad 212, and a power pad 213 are arranged above the semiconductor substrate 150. The signal pad 212 and the power pad 213 are located in the circuit core area 110. The power pad 213 is electrically connected to a first connection portion of the first semiconductor element 120 via a power rail 214. The power pad 211 is located on an edge portion of the circuit core area 110. Besides, the power pad 211 is electrically connected to a second connection portion of the first semiconductor element 120.

The circuit core area 110 further has a plurality of semiconductor devices, e.g., diodes 220 and 230 of the TVS. The diodes 220 and 230 are located in the circuit core area 110. The circuit core area 110 shown in FIG. 2A may further include other semiconductor elements, and the invention is not limited thereto. The diode 230 is located between the power pad 213 and the signal pad 212. A first terminal (e.g., the anode) of the diode 230 is electrically connected to the power pad 213, and a second terminal (e.g., the cathode) of the diode 230 is electrically connected to the signal pad 212. The signal pad 212 can be electrically connected to circuits in the circuit core area 110. Therefore, the circuits in the circuit core area 110 can receive signals from the outside of the integrated circuit via the signal pad 212 or output signals to the outside of the integrated circuit.

In the embodiment shown in FIG. 2A, the diode 230 includes a plurality of first electrodes 231 and a plurality of second electrodes 232. The first electrodes 231 and the second electrodes 232 are alternately arranged as fingers (or forks). The first electrodes 231 are electrically connected to a p-doped area (not shown) below the first electrodes 231, and the second electrodes 232 are electrically connected to an n-doped area (not shown) below the second electrodes 232. Here, the p-doped area and the n-doped area together constitute the diode 230. Accordingly, the first electrodes 231 may act as the first terminal (e.g., the anode) of the diode 230 and may be electrically connected to the power pad 213, and the second electrodes 232 may act as the second terminal (e.g., the cathode) of the diode 230 and may be electrically connected to the signal pad 212.

The diode 220 is located between a third connection portion of the first semiconductor element 120 and the signal pad 212. A first terminal (e.g., the anode) of the diode 220 is electrically connected to the signal pad 212, and a second terminal (e.g., the cathode) of the diode 220 is electrically connected to the third connection portion of the first semiconductor element 120. The third connection portion of the first semiconductor element 120 can be electrically connected to the second connection portion of the first semiconductor element 120 via a metal conductive wire and can be further electrically connected to the power pad 211. Hence, the second terminal (e.g., the cathode) of the diode 220 can be electrically connected to the power pad 211 through the third connection portion of the first semiconductor element 120.

In the embodiment shown in FIG. 2A, the diode 220 includes a plurality of third electrodes 221 and a plurality of fourth electrodes 222. The third electrodes 221 and the fourth electrodes 222 are alternately arranged as fingers (or forks). The third electrodes 221 are electrically connected to a p-doped area (not shown) below the third electrodes 221, and the fourth electrodes 222 are electrically connected to an n-doped area (not shown) below the fourth electrodes 222. Here, the p-doped area and the n-doped area together constitute the diode 220. Accordingly, the third electrodes 221 may act as the first terminal (e.g., the anode) of the diode 220 and may be electrically connected to the signal pad 212, and the fourth electrodes 222 may act as the second terminal (e.g., the cathode) of the diode 220 and may be electrically connected to the third connection portion of the first semiconductor element 120 and the power pad 211.

In the embodiment shown in FIG. 2A, the first semiconductor element 120 can be an ESD clamp element 240 in the TVS. The ESD clamp element 240 can be a Zener diode or any other clamp element. The anode of the ESD clamp element 240 is electrically connected to the power pad 213, and the cathode of the ESD clamp element 240 is electrically connected to the power pad 211.

The ESD clamp element 240 (i.e., the first semiconductor element 120) at least partially surrounds the periphery of the circuit core area 110. In the embodiment shown in FIG. 2A, the first semiconductor element 120 includes a second-electrode line 241, a first-electrode line 242, and a second-electrode ring 243. The second-electrode line 241, the first-electrode line 242, and the second-electrode ring 243 are arranged on the semiconductor substrate 105. The first-electrode line 242 is shaped as two letters C and surrounds the periphery of the circuit core area 110, as shown in FIG. 2A. In another embodiment, the first-electrode line 242 may be shaped as a ring or may have any other geometrical shape and surround the periphery of the circuit core area 110. A first connection portion of the first-electrode line 242 may be electrically connected to the power pad 213 via the power rail 214. The second-electrode ring 243 surrounds the periphery of the circuit core area 110, and a second connection portion of the second-electrode ring 243 is electrically connected to the power pad 211. The second-electrode line 241 is shaped as four letters L and surrounds the periphery of the circuit core area 110, as shown in FIG. 2A. In another embodiment, the second-electrode line 241 may be shaped as a letter C, a ring, or may have any other geometrical shape and surround the periphery of the circuit core area 110. The second-electrode line 241 is electrically connected to the power pad 211.

Here, the first-electrode line 242 is arranged between the second-electrode ring 243 and the second-electrode line 241. The first-electrode line 242 is electrically connected to a p-doped area (not shown) below the first-electrode line 242, and the second-electrode ring 243 and the second-electrode line 241 electrically connected to an n-doped area (not shown) below the second-electrode line 241. Here, the p-doped area and the n-doped area together constitute the ESD clamp element 240 (e.g., the Zener diode). Hence, the first-electrode line 242 may serve as the first electrode (e.g., the anode) of the ESD clamp element 240, and the second-electrode ring 243 and the second-electrode line 241 may serve as the second electrode (e.g., the cathode) of the ESD clamp element 240.

It can be learned from FIG. 2A that the first semiconductor element 120 (e.g., the ESD clamp element 240) surrounding the periphery of the circuit core area 110 has the PN junction with certain length, and therefore the first semiconductor element 120 can instantaneously and effectively transmit a significant amount of the transient current (e.g., the ESD current). The increase in the circuit core area 110 leads to the increase in the length of the PN junction of the first semiconductor element 120 and the improvement of the current transmission capability of the first semiconductor element 120. Therefore, the TVS shown in FIG. 2A can effectively raise the ESD level. Besides, according to the embodiment shown in FIG. 2A, the first semiconductor element 120 (e.g., the ESD clamp element 240) occupying the largest area is arranged on the periphery of the circuit core area 110, such that the first semiconductor element 120 surrounds the circuit core area 110 (e.g., the core circuit); hence, the die size can be effectively reduced.

Figure 3A:
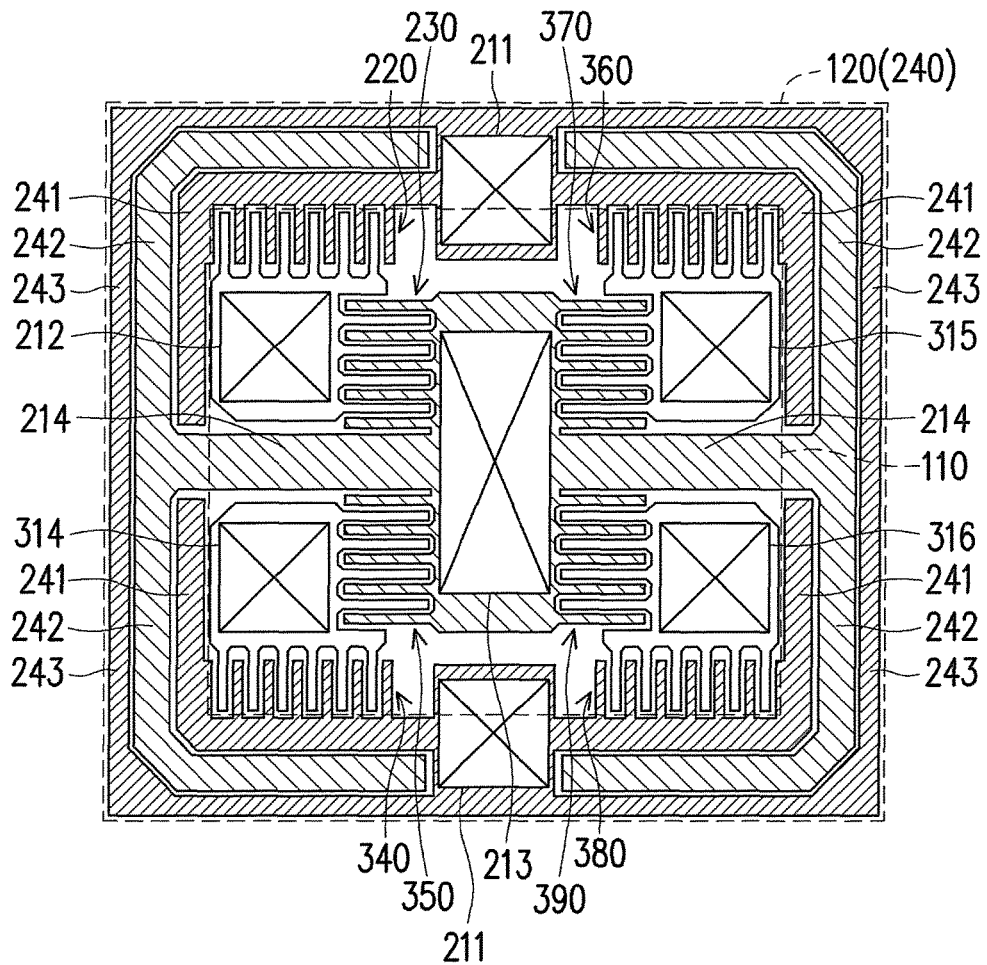
FIG. 3A is a schematic diagram illustrating a circuitry layout of the semiconductor device according to another embodiment of the invention, and the semiconductor device is shown in FIG. 1.
Figure 3B:
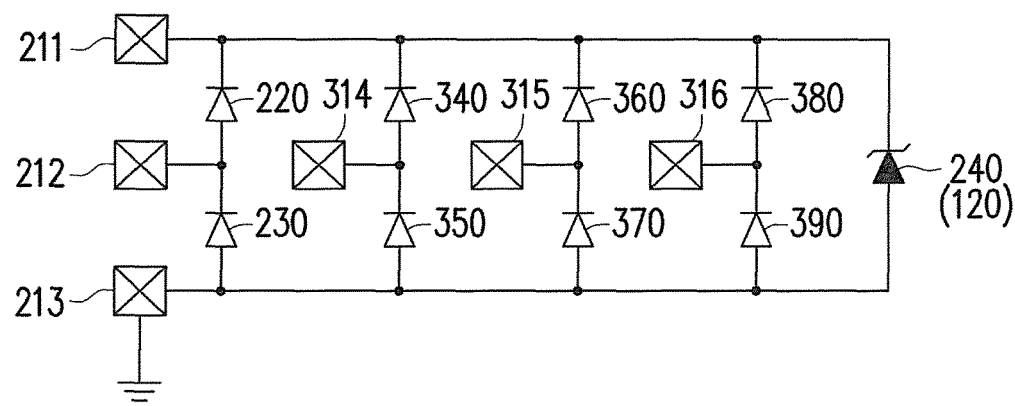
FIG. 3B is a schematic equivalent circuit diagram illustrating the semiconductor device depicted in FIG. 3A.

FIG. 3A is a schematic diagram illustrating a circuitry layout of the semiconductor device 100 according to another embodiment of the invention, and the semiconductor device 100 is shown in FIG. 1. FIG. 3B is a schematic equivalent circuit diagram illustrating the semiconductor device 100 depicted in FIG. 3A. With reference to FIG. 3A and FIG. 3B, the semiconductor device 100 may serve as a TVS or an ESD protection circuit. The semiconductor device 100 includes a circuit core area 110 and a first semiconductor element 120. The signal pads 212, 314, 315, and 316 and the power pad 213 are located in the circuit core area 110. The power pad 213 is electrically connected to the first connection portion of the first semiconductor element 120 via the power rail 214. The power pad 211 is located on the edge portion of the circuit core area 110. Besides, the power pad 211 is electrically connected to the second connection portion of the first semiconductor element 120.

The circuit core area 110 has a plurality of semiconductor elements. For instance, the TVS shown in FIG. 3B further includes diodes 220, 230, 340, 350, 360, 370, 380, and 390 which are arranged in the circuit core area 110. The diode 230 is located between the power pad 213 and the signal pad 212. The first terminal (e.g., the anode) of the diode 230 is electrically connected to the power pad 213, and the second terminal (e.g., the cathode) of the diode 230 is electrically connected to the signal pad 212. The diode 220 is located between the third connection portion of the first semiconductor element 120 and the signal pad 212. The first terminal (e.g., the anode) of the diode 220 is electrically connected to the signal pad 212, and the second terminal (e.g., the cathode) of the diode 220 is electrically connected to the third connection portion of the first semiconductor element 120. The diode 350 is located between the power pad 213 and the signal pad 314. A first terminal (e.g., the anode) of the diode 350 is electrically connected to the power pad 213, and a second terminal (e.g., the cathode) of the diode 350 is electrically connected to the signal pad 314. The diode 340 is located between the first semiconductor element 120 and the signal pad 314. A first terminal (e.g., the anode) of the diode 340 is electrically connected to the signal pad 314, and a second terminal (e.g., the cathode) of the diode 340 is electrically connected to the power pad 211 via the first semiconductor element 120. The diode 370 is located between the power pad 213 and the signal pad 315. A first terminal (e.g., the anode) of the diode 370 is electrically connected to the power pad 213, and a second terminal (e.g., the cathode) of the diode 370 is electrically connected to the signal pad 315. The diode 360 is located between the first semiconductor element 120 and the signal pad 315. A first terminal (e.g., the anode) of the diode 360 is electrically connected to the signal pad 315, and a second terminal (e.g., the cathode) of the diode 360 is electrically connected to the power pad 211 via the first semiconductor element 120. The diode 390 is located between the power pad 213 and the signal pad 316. A first terminal (e.g., the anode) of the diode 390 is electrically connected to the power pad 213, and a second terminal (e.g., the cathode) of the diode 390 is electrically connected to the signal pad 316. The diode 380 is located between the first semiconductor element 120 and the signal pad 316. A first terminal (e.g., the anode) of the diode 380 is electrically connected to the signal pad 316, and a second terminal (e.g., the cathode) of the diode 380 is electrically connected to the power pad 211 via the first semiconductor element 120.

The descriptions of the diodes 220, 230, 340, 350, 360, 370, 380, and 390 shown in FIG. 3A may be deduced from the descriptions of the diodes 220 and 230 shown in FIG. 2A and thus may not be further provided hereinafter. The descriptions of the first semiconductor element 120 (e.g., the ESD clamp element 240) shown in FIG. 3A may be deduced from the descriptions of the first semiconductor element 120 shown in FIG. 2A and thus may not be further provided hereinafter. The descriptions of the signal pads 212, 314, 315, and 316 shown in FIG. 3A may be deduced from the description of the signal pad 212 shown in FIG. 2A and thus may not be further provided hereinafter.

Figure 4:
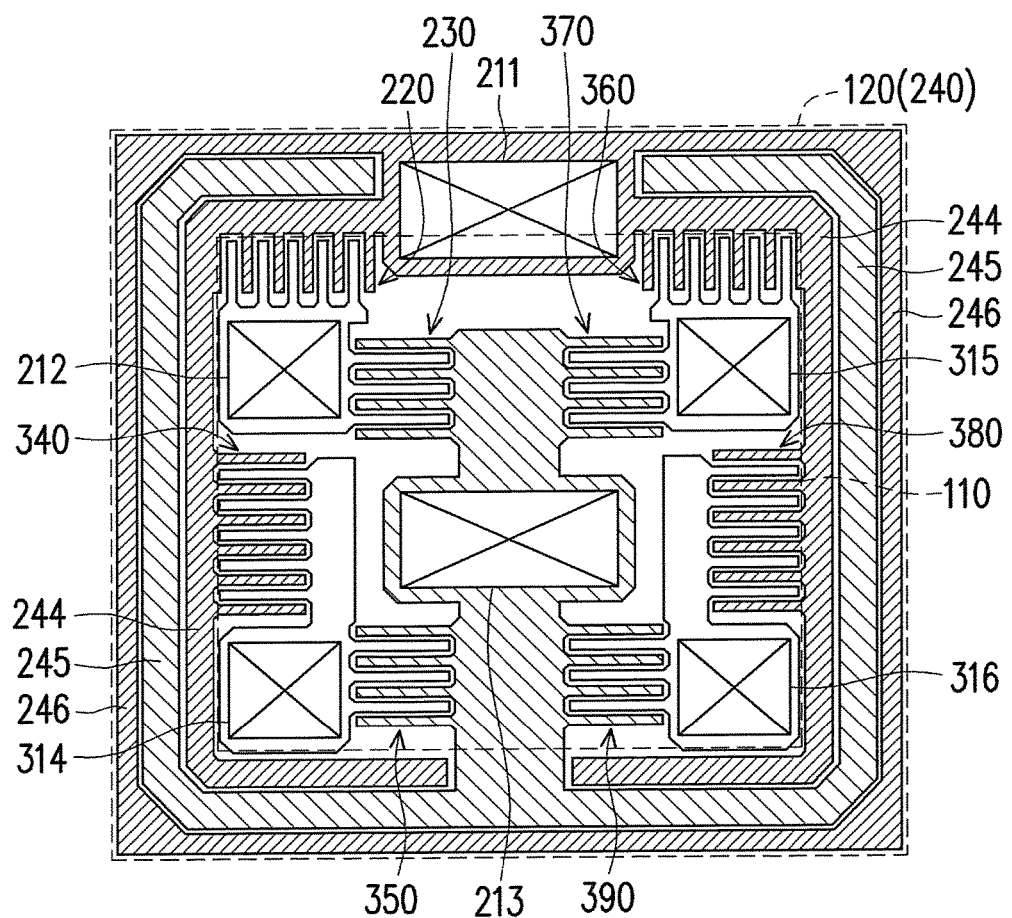
FIG. 4 is a schematic diagram illustrating a circuitry layout of the semiconductor device according to still another embodiment of the invention, and the semiconductor device is shown in FIG. 1.

FIG. 4 is a schematic diagram illustrating a circuitry layout of the semiconductor device 100 according to still another embodiment of the invention, and the semiconductor device is shown in FIG. 1. The descriptions of the schematic equivalent circuit diagram (FIG. 4) may be deduced from the descriptions of the previous schematic equivalent circuit diagram (FIG. 3B). With reference to FIG. 3B and FIG. 4, the semiconductor device 100 may serve as a TVS or an ESD protection circuit. The semiconductor device 100 includes a circuit core area 110 and a first semiconductor element 120. The signal pads 212, 314, 315, and 316 and the power pad 213 are located in the circuit core area 110. The power pad 213 is electrically connected to the first connection portion of the first semiconductor element 120 via the power rail. The power pad 211 is located on the edge portion of the circuit core area 110. Besides, the power pad 211 is electrically connected to the second connection portion of the first semiconductor element 120.

The descriptions of the diodes 220, 230, 340, 350, 360, 370, 380, and 390 shown in FIG. 4 may be deduced from the description of the diodes 220, 230, 340, 350, 360, 370, 380, and 390 shown in FIG. 3A and thus may not be further provided hereinafter. The descriptions of the first semiconductor element 120 (e.g., the ESD clamp element 240) shown in FIG. 4 may be deduced from the descriptions of the first semiconductor element 120 shown in FIG. 2A and thus may not be further provided hereinafter. The descriptions of the signal pads 212, 314, 315, and 316 shown in FIG. 4 may be deduced from the description of the signal pad 212 shown in FIG. 2A and thus may not be further provided hereinafter.

The ESD clamp element 240 (i.e., the first semiconductor element 120) surrounds the periphery of the circuit core area 110. In the embodiment shown in FIG. 4, the first semiconductor element 120 includes a second-electrode line 244, a first-electrode line 245, and a second-electrode ring 246. The second-electrode line 244, the first-electrode line 245, and the second-electrode ring 246 are arranged on the semiconductor substrate 105. The first-electrode line 245 is shaped as two letters C and surrounds the periphery of the circuit core area 110, as shown in FIG. 4. In another embodiment, the first-electrode line 245 may be shaped as a ring or may have any other geometrical shape and surround the periphery of the circuit core area 110. The first connection portion of the first-electrode line 245 may be electrically connected to a power pad 213 via a power rail. The second-electrode ring 246 surrounds the periphery of the circuit core area 110, and a second connection portion of the second-electrode ring 246 is electrically connected to the power pad 211. The second-electrode line 244 is shaped as a letter C and surrounds the periphery of the circuit core area 110, as shown in FIG. 4. In some embodiments, the second-electrode line 244 may be shaped as a ring or may have any other geometrical shape and surround the periphery of the circuit core area 110. The second-electrode line 244 is electrically connected to the power pad 211.

The first-electrode line 245 is arranged between the second-electrode ring 246 and the second-electrode line 244. The first-electrode line 245 is electrically connected to a p-doped area (not shown) below the first-electrode line 245, and the second-electrode ring 246 and the second-electrode line 244 electrically connected to an n-doped area (not shown) below the second-electrode line 246. Here, the p-doped area and the n-doped area together constitute the ESD clamp element 240 (e.g., the Zener diode). Hence, the first-electrode line 245 may serve as the first electrode (e.g., the anode) of the ESD clamp element 240, and the second-electrode ring 246 and the second-electrode line 244 may serve as the second electrode (e.g., the cathode) of the ESD clamp element 240.

Figure 5A:
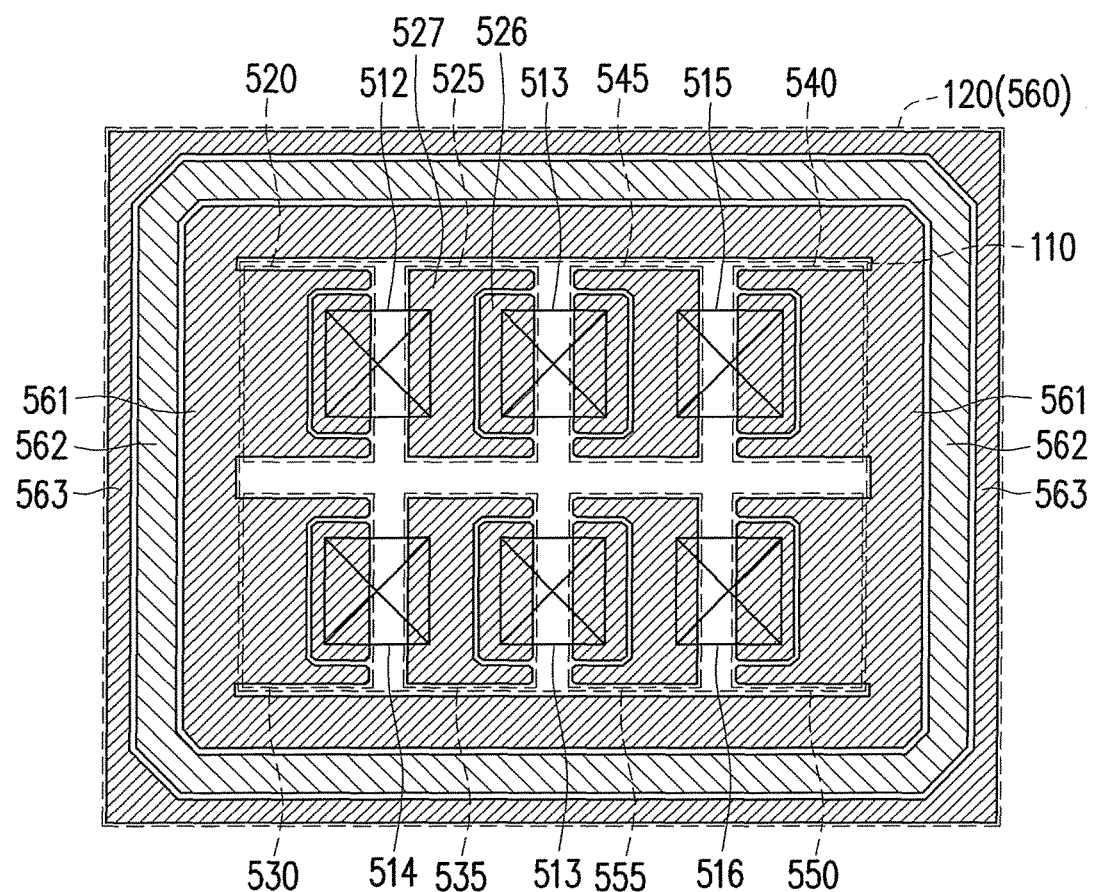
FIG. 5A is a schematic diagram illustrating a circuitry layout of the semiconductor device according to still another embodiment of the invention, and the semiconductor device is shown in FIG. 1.
Figure 5B:
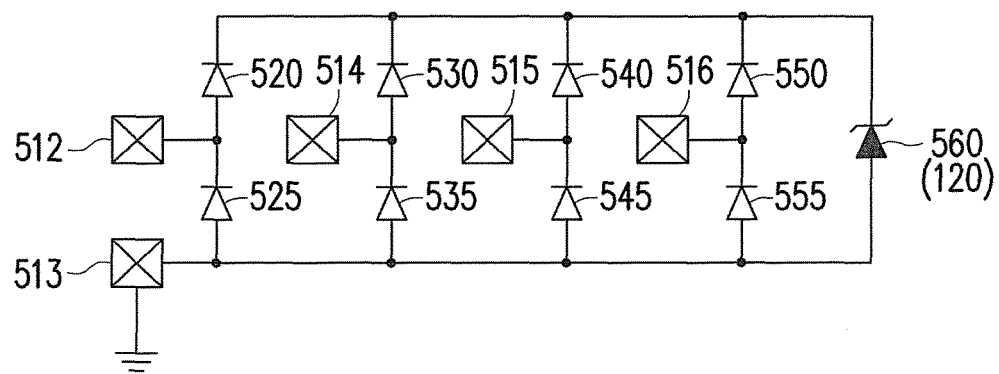
FIG. 5B is a schematic equivalent circuit diagram illustrating the semiconductor device depicted in FIG. 5A.

FIG. 5A is a schematic diagram illustrating a circuitry layout of the semiconductor device 100 according to still another embodiment of the invention, and the semiconductor device 100 is shown in FIG. 1. FIG. 5B is a schematic equivalent circuit diagram illustrating the semiconductor device 100 depicted in FIG. 5A. With reference to FIG. 5A and FIG. 5B, the semiconductor device 100 may serve as a TVS or an ESD protection circuit. The semiconductor device 100 includes a circuit core area 110 and a first semiconductor element 120. The signal pads 512, 514, 515, and 516 and the power pad 513 are located in the circuit core area 110. The power pad 513 is electrically connected to the first connection portion of the first semiconductor element 120 via a power rail (not shown). The signal pads 512, 514, 515, and 516 are located between the first semiconductor element 120 and the signal pad 513.

The circuit core area 110 has a plurality of semiconductor elements. For instance, the TVS shown in FIG. 5B further includes diodes 520, 525, 530, 535, 540, 545, 550, and 555 which are arranged in the circuit core area 110. The diode 520 is located between the second connection portion of the first semiconductor element 120 and the signal pad 512. A first terminal (e.g., the anode) of the diode 520 is electrically connected to the signal pad 512, and a second terminal (e.g., the cathode) of the diode 520 is electrically connected to the second connection portion of the first semiconductor element 120. The diode 525 is located between the power pad 513 and the signal pad 512. A first terminal (e.g., the anode) of the diode 525 is electrically connected to the power pad 513, and a second terminal (e.g., the cathode) of the diode 525 is electrically connected to the signal pad 512. The diode 530 is located between the first semiconductor element 120 and the signal pad 514. A first terminal (e.g., the anode) of the diode 530 is electrically connected to the signal pad 514, and a second terminal (e.g., the cathode) of the diode 530 is electrically connected to the second-electrode line 561 of the first semiconductor element 120. The diode 535 is located between the power pad 513 and the signal pad 514. A first terminal (e.g., the anode) of the diode 535 is electrically connected to the power pad 513, and a second terminal (e.g., the cathode) of the diode 535 is electrically connected to the signal pad 514. The diode 540 is located between the first semiconductor element 120 and the signal pad 515. A first terminal (e.g., the anode) of the diode 540 is electrically connected to the signal pad 515, and a second terminal (e.g., the cathode) of the diode 540 is electrically connected to the second-electrode line 561 of the first semiconductor element 120. The diode 545 is located between the power pad 513 and the signal pad 515. A first terminal (e.g., the anode) of the diode 545 is electrically connected to the power pad 513, and a second terminal (e.g., the cathode) of the diode 545 is electrically connected to the signal pad 515. The diode 550 is located between the first semiconductor element 120 and the signal pad 516. A first terminal (e.g., the anode) of the diode 550 is electrically connected to the signal pad 516, and a second terminal (e.g., the cathode) of the diode 550 is electrically connected to the second-electrode line 561 of the first semiconductor element 120. The diode 555 is located between the power pad 513 and the signal pad 516. A first terminal (e.g., the anode) of the diode 555 is electrically connected to the power pad 513, and a second terminal (e.g., the cathode) of the diode 555 is electrically connected to the signal pad 516.

An embodiment of the diode 525 is provided hereinafter. The descriptions of other diodes 520, 530, 535, 540, 545, 550, and 555 may be deduced from the description of the diode 525 and thus will no longer be provided hereinafter. The diode 525 includes a first electrode 526 and a second electrode 527. The first electrode 526 acts as the first terminal of the diode 525 and is electrically connected to the power pad 513. The second electrode 527 acts as the second terminal of the diode 525 and is electrically connected to the signal pad 512. Here, the second electrode 527 is shaped as a letter C and surrounds the periphery of the first electrode 526, and the second electrode 527 is not in contact with the first electrode 526. The first electrode 526 is electrically connected to a p-doped area (not shown) below the first electrode 526, and the second electrode 527 is electrically connected to an n-doped area (not shown) below the second electrode 527. Here, the p-doped area and the n-doped area together constitute the diode 525. Accordingly, the first electrode 526 may act as the first terminal (e.g., the anode) of the diode 525 and may be electrically connected to the power pad 513, and the second electrode 527 may act as the second terminal (e.g., the cathode) of the diode 525 and may be electrically connected to the signal pad 512.

The ESD clamp element 560 (i.e., the first semiconductor element 120) surrounds the periphery of the circuit core area 110. In the embodiment shown in FIG. 5A, the first semiconductor element 120 includes a second-electrode line 561, a first-electrode line 562, and a second-electrode ring 563. The second-electrode line 561, the first-electrode line 562, and the second-electrode ring 563 are arranged on the semiconductor substrate 105. The first-electrode line 562 is shaped as a ring and surrounds the periphery of the circuit core area 110, as shown in FIG. 5A. The first connection portion of the first-electrode line 562 may be electrically connected to the power pad 513 via a power rail (not shown). The second-electrode ring 563 surrounds the periphery of the circuit core area 110, and a second connection portion of the second-electrode ring 563 is electrically connected to the diode 520. The second-electrode line 561 is shaped as a ring and surrounds the periphery of the circuit core area 110, as shown in FIG. 5A.

The first-electrode line 562 is arranged between the second-electrode ring 563 and the second-electrode line 561. The first-electrode line 562 is electrically connected to a p-doped area (not shown) below the first-electrode line 562, and the second-electrode ring 563 and the second-electrode line 561 electrically connected to an n-doped area (not shown) below the second-electrode ring 563 and the second-electrode line 561. Here, the p-doped area and the n-doped area together constitute the ESD clamp element 560 (e.g., the Zener diode). Hence, the first-electrode line 562 may serve as the first electrode (e.g., the anode) of the ESD clamp element 560, and the second-electrode ring 563 and the second-electrode line 561 may serve as the second electrode (e.g., the cathode) of the ESD clamp element 560.

Figure 6:
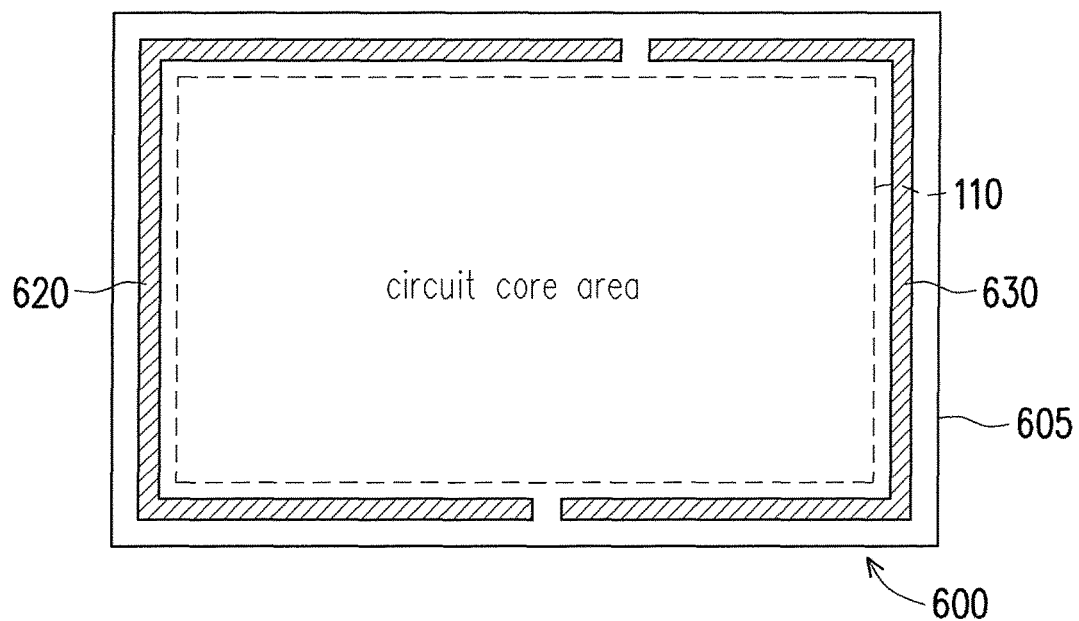
FIG. 6 is a schematic top view illustrating a layout of a semiconductor device according to another embodiment of the invention.

FIG. 6 is a schematic top view illustrating a layout of a semiconductor device 600 according to another embodiment of the invention. The semiconductor device 600 includes a semiconductor substrate 605, the circuit core area 110, a first semiconductor element 620, and a second semiconductor element 630. The circuit core area 110, the first semiconductor element 620, and the second semiconductor element 630 are arranged on the semiconductor substrate 605. The first semiconductor element 620 and the second semiconductor element 630 are respectively shaped as a letter C and surround the periphery of the circuit core area 110. The circuit core area 110 has a plurality of semiconductor elements (not shown). Here, a layout area of the first semiconductor device 620 is larger than a layout area of any of the semiconductor devices in the circuit core area 110, and a layout area of the second semiconductor device 630 is also larger than the layout area of any of the semiconductor devices in the circuit core area 110. The description of the circuit core area 110 as shown in FIG. 6 may be deduced from the description of the circuit core area 110 as shown in FIG. 1, and the descriptions of the first semiconductor element 620 and the second semiconductor element 630 as shown in FIG. 6 may be deduced from the description of the first semiconductor element 120 as shown in FIG. 1.

According to some embodiments of the invention, the first semiconductor element 620 and the second semiconductor element 630 may be Zener diodes, power transistors, or any other semiconductor element capable of transmitting a significant amount of transient current. However, the invention is not limited thereto. In the semiconductor device 600 provided in the present embodiment, the first semiconductor element 620 and the second semiconductor element that occupy the largest area are arranged on the periphery of the circuit core area 110 rather than in the circuit core area 110. The first semiconductor element 620 and the second semiconductor element 630 surround the circuit core area 110 (e.g., the core circuit); therefore, the die size can be effectively reduced, and a significant amount of current can be instantaneously and effectively transmitted. The increase in the circuit core area 110 leads to the improvement of the current transmission capability of the first semiconductor element 620 and the second semiconductor element 630.

Figure 7A:
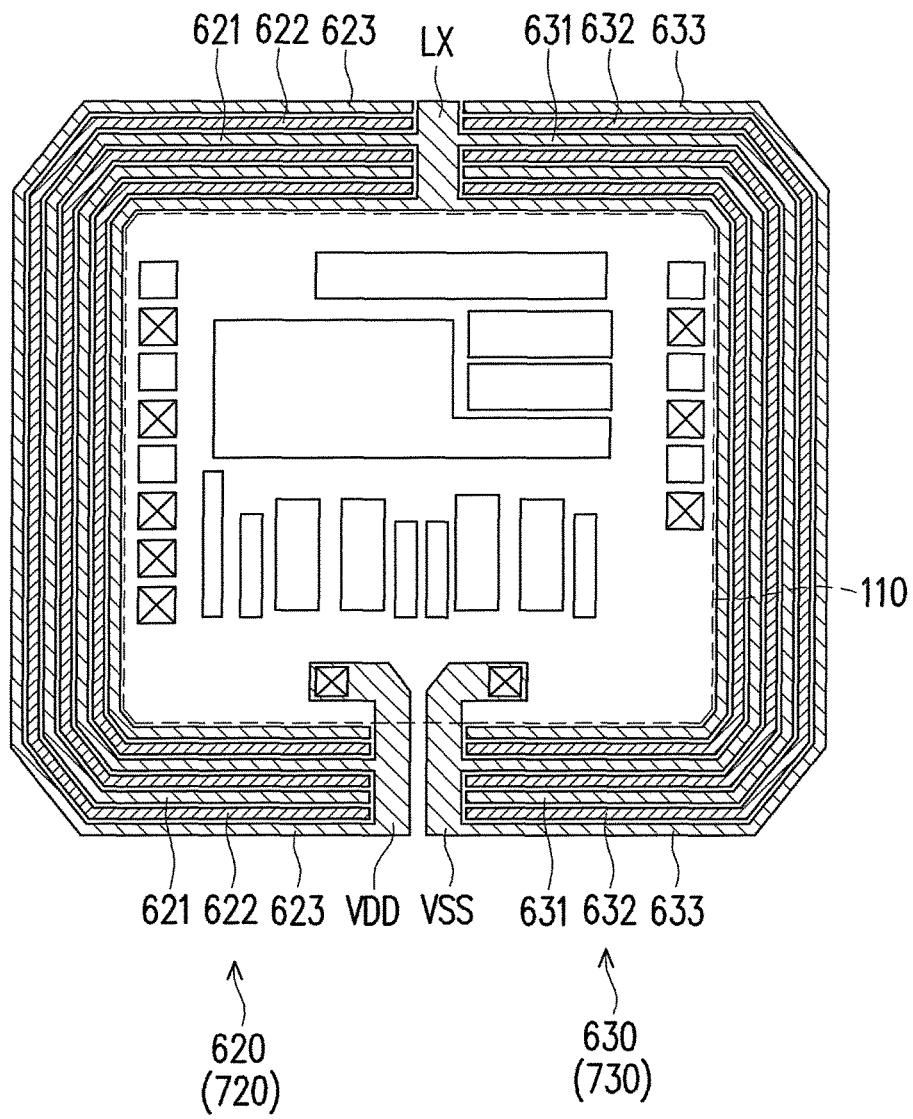
FIG. 7A is a schematic diagram illustrating a circuitry layout of the semiconductor device according to an embodiment of the invention, and the semiconductor device is shown in FIG. 6.
Figure 7B:
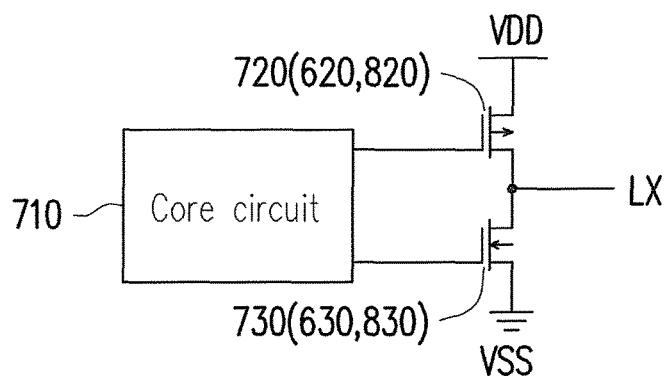
FIG. 7B is a schematic equivalent circuit diagram illustrating the semiconductor device depicted in FIG. 7A.

FIG. 7A is a schematic diagram illustrating a circuitry layout of the semiconductor device 600 according to an embodiment of the invention, and the semiconductor device is shown in FIG. 6. FIG. 7B is a schematic equivalent circuit diagram illustrating the semiconductor device 600 depicted in FIG. 7A. With reference to FIG. 7A and FIG. 7B, the semiconductor device 600 may serve as an output stage of a power integrated circuit (power IC). The power IC may be made by performing a CMOS high voltage manufacturing process or another manufacturing process, and the transistor structure of the power IC may be a metal-oxide semiconductor (MOS) structure or any other structure.

The power IC shown in FIG. 7B includes a core circuit 710 and an output stage (i.e., power transistors 720 and 730). The core circuit 710 is located in the circuit core area 110. The core circuit 710 may include a driving circuit, a driving controller, and/or other elements. The power transistor 720 (i.e., the first semiconductor element 620) and the power transistor 730 (i.e., the second semiconductor element 630) are respectively shaped as a letter C and surround the periphery of the circuit core area 110, as shown in FIG. 7A. The power transistor 720 may be a p-channel metal-oxide semiconductor (PMOS) transistor, and the power transistor 730 may be an n-channel metal-oxide semiconductor (NMOS) transistor. Through the control of the core circuit 710, the output stage (i.e., the power transistors 720 and 730) of the power IC can supply power to a load circuit (not shown) via an output end LX. Since the output stage of the power IC is required to instantaneously provide a great amount of current to the load circuit, the power transistors 720 and 730 of the output stage need to occupy a significant area.

The first semiconductor element 620 (e.g., the power transistor 720) includes a drain line 621, a gate line 622, and a source line 623. The drain line 621, the gate line 622, and the source line 623 are arranged on the semiconductor substrate 605 and individually shaped as a letter C and surround the periphery of the circuit core area 110, as shown in FIG. 7A. In another embodiment, the drain line 621, the gate line 622, and the source line 623 may be shaped as a ring or may have any other geometrical shape and surround the periphery of the circuit core area 110. The gate line 622 is arranged between the source line 623 and the drain line 621. Transistor structures (not shown) are arranged below the drain line 621, the gate line 622, and the source line 623. The drain line 621 is electrically connected to the drain of the transistor structure below the drain line 621, the gate line 622 is electrically connected to the gate of the transistor structure below the gate line 622, and the source line 623 is electrically connected to the source of the transistor structure below the source line 623. The drain line 621 is electrically connected to an output terminal LX. The source line 623 is electrically connected to a power rail VDD.

The second semiconductor element 630 (e.g., the power transistor 730) includes a drain line 631, a gate line 632, and a source line 633. The drain line 631, the gate line 632, and the source line 633 are arranged on the semiconductor substrate 605 and individually shaped as a letter C and surround the periphery of the circuit core area 110, as shown in FIG. 7A. In another embodiment, the drain line 631, the gate line 632, and the source line 633 may be shaped as a ring or may have any other geometrical shape and surround the periphery of the circuit core area 110. The gate line 632 is arranged between the source line 633 and the drain line 631. Transistor structures (not shown) are arranged below the drain line 631, the gate line 632, and the source line 633. The drain line 631 is electrically connected to the drain of the transistor structure below the drain line 631, the gate line 632 is electrically connected to the gate of the transistor structure below the gate line 632, and the source line 633 is electrically connected to the source of the transistor structure below the source line 633. The drain line 631 is electrically connected to an output terminal LX. The source line 633 is electrically connected to a power rail VSS.

It can be learned from FIG. 7A that the first semiconductor element 620 (e.g., the power transistor 720) and the second semiconductor element 630 (e.g., the power transistor 730) which surround the periphery of the circuit core area 110 have the large channel width, and therefore the first semiconductor element 620 and the second semiconductor element 630 can instantaneously and effectively transmit a significant amount of the transient current. The increase in the circuit core area 110 leads to the increase in the channel width of the first semiconductor element 620 and the second semiconductor element 630 and further leads to the improvement of the current transmission capability of the first semiconductor element 620 and the second semiconductor element 630. Hence, the first semiconductor element 620 (e.g., the power transistor 720) and the second semiconductor element 630 (e.g., the power transistor 730) of the power IC shown in FIG. 7A may effectively increase the amount of transmitted current. From another perspective, according to the embodiment shown in FIG. 7A, the first semiconductor element 620 (e.g., the power transistor 720) and the second semiconductor element 630 (e.g., the power transistor 730) which occupy the largest area are arranged on the periphery of the circuit core area 110, such that the first semiconductor element 620 and the second semiconductor element 630 surround the circuit core area 110 (e.g., the core circuit); as a result, the die size can be effectively reduced.

Figure 8:
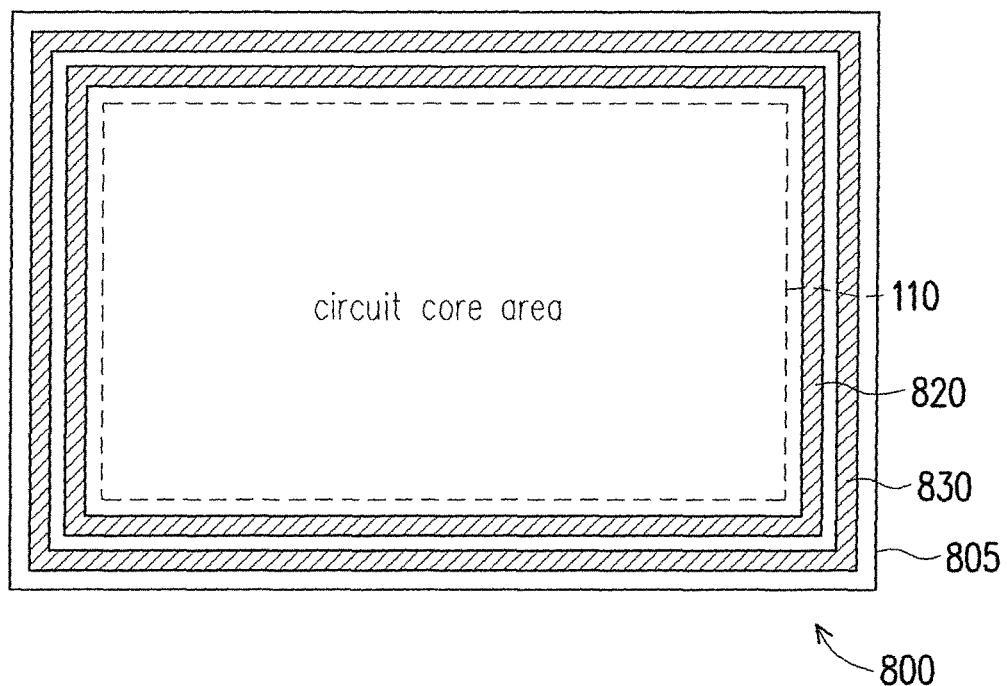
FIG. 8 is a schematic top view illustrating a layout of a semiconductor device according to still another embodiment of the invention.

FIG. 8 is a schematic top view illustrating a layout of a semiconductor device 800 according to still another embodiment of the invention. The semiconductor device 800 includes a semiconductor substrate 805, the circuit core area 110, a first semiconductor element 820, and a second semiconductor element 830. The circuit core area 110, the first semiconductor element 820, and the second semiconductor element 830 are arranged on the semiconductor substrate 805. The first semiconductor element 820 and the second semiconductor element 830 are respectively shaped as a ring and surround the periphery of the circuit core area 110. The circuit core area 110 has a plurality of semiconductor elements (not shown). Here, a layout area of the first semiconductor device 820 is larger than a layout area of any of the semiconductor devices in the circuit core area 110, and a layout area of the second semiconductor device 830 is also larger than the layout area of any of the semiconductor devices in the circuit core area 110. The description of the circuit core area 110 as shown in FIG. 8 may be deduced from the description of the circuit core area 110 as shown in FIG. 1, and the descriptions of the first semiconductor element 820 and the second semiconductor element 830 as shown in FIG. 8 may be deduced from the description of the first semiconductor element 120 as shown in FIG. 1.

According to some embodiments of the invention, the first semiconductor element 820 and the second semiconductor element 830 may be Zener diodes, power transistors, or any other semiconductor element capable of transmitting a significant amount of transient current. However, the invention is not limited thereto. In the semiconductor device 800 provided in the present embodiment, the first semiconductor element 820 and the second semiconductor element 830 that occupy the largest area are arranged on the periphery of the circuit core area 110 rather than in the circuit core area 110. The first semiconductor element 820 and the second semiconductor element 830 surround the circuit core area 110 (e.g., the core circuit); therefore, the die size can be effectively reduced, and a significant amount of current can be instantaneously and effectively transmitted. The increase in the circuit core area 110 leads to the improvement of the current transmission capability of the first semiconductor element 820 and the second semiconductor element 830.

Figure 9A:
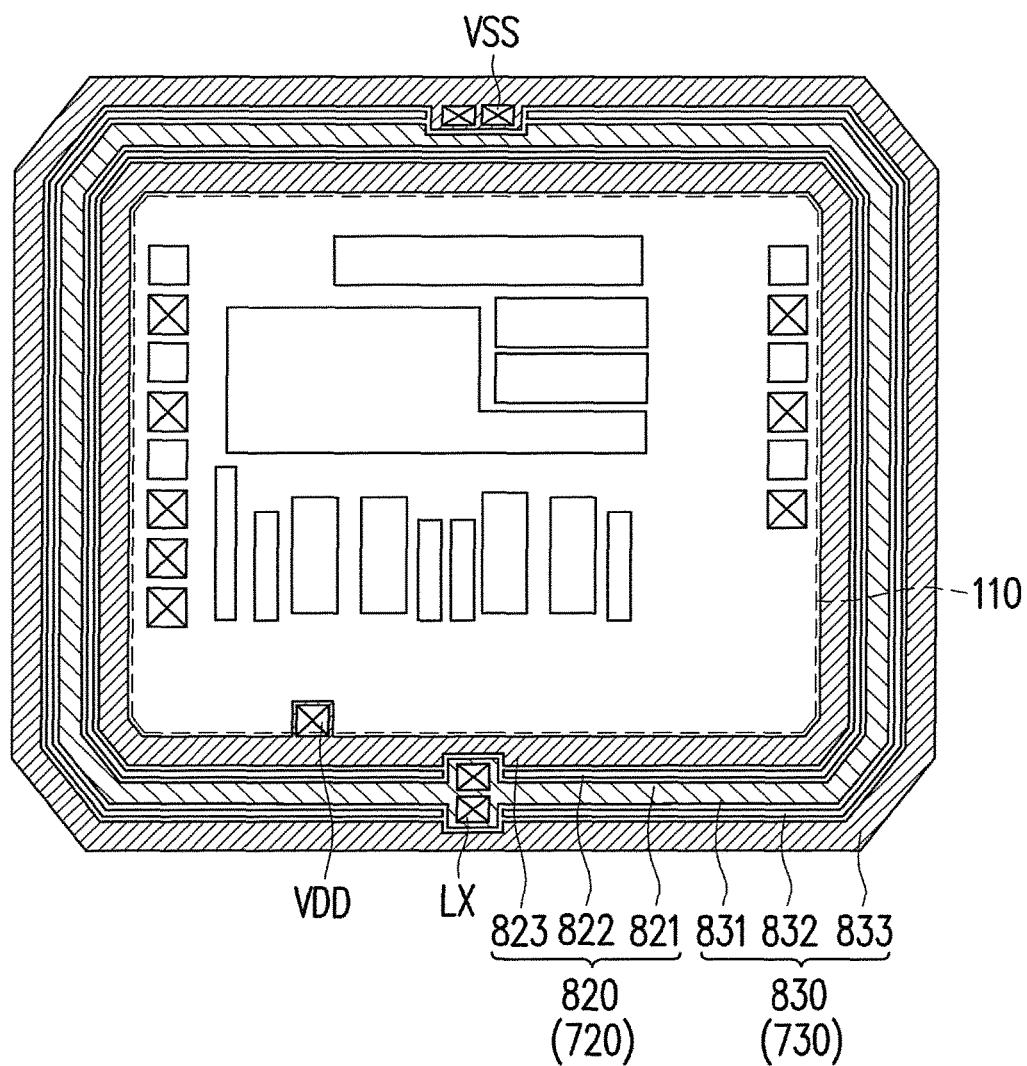
FIG. 9A is a schematic diagram illustrating a circuitry layout of the semiconductor device according to an embodiment of the invention, and the semiconductor device is shown in FIG. 8.

FIG. 9A is a schematic diagram illustrating a circuitry layout of the semiconductor device 800 according to an embodiment of the invention, and the semiconductor device is shown in FIG. 8. The descriptions of the schematic equivalent circuit diagram (FIG. 9A) may be deduced from the descriptions of the previous schematic equivalent circuit diagram (FIG. 7B). With reference to FIG. 7B and FIG. 9A, the semiconductor device 800 may serve as an output stage of a power IC. The power transistor 720 (i.e., the first semiconductor element 820) and the power transistor 730 (i.e., the second semiconductor element 830) are respectively shaped as a ring and surround the periphery of the circuit core area 110, as shown in FIG. 9A.

The power transistor 720 is a PMOS transistor in this embodiment. The first semiconductor element 820 (e.g., the power transistor 720) includes a drain line 821, a gate line 822, and a source line 823. The drain line 821, the gate line 822, and the source line 823 are arranged on the semiconductor substrate 805 and individually shaped as a ring and surround the periphery of the circuit core area 110, as shown in FIG. 9A. The gate line 822 is arranged between the source line 823 and the drain line 821. The drain line 821 is electrically connected to an output terminal LX. The source line 823 is electrically connected to a power rail VDD.

Figure 9B:
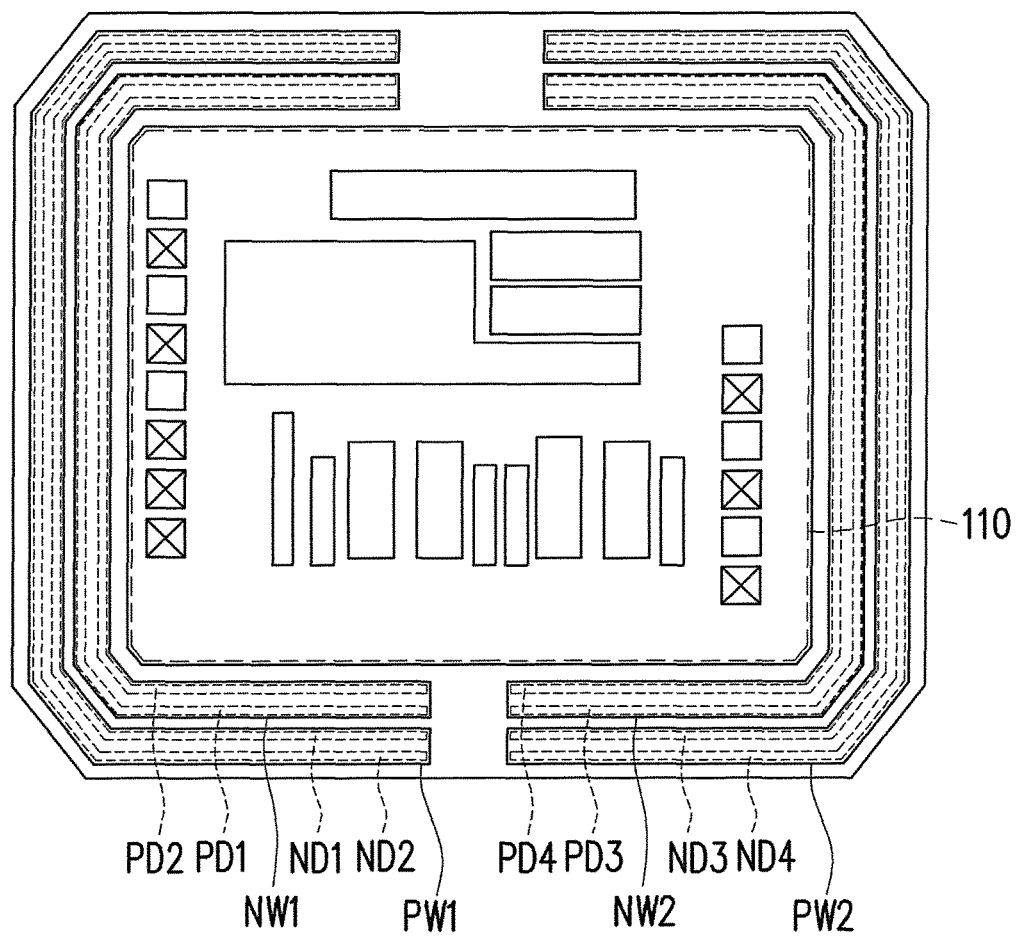
FIG. 9B is a schematic diagram illustrating a layout of doped layers in the semiconductor device depicted in FIG. 9A.

FIG. 9B is a schematic diagram illustrating a layout of doped layers in the semiconductor device 800 depicted in FIG. 9A. With reference to FIG. 9A and FIG. 9B, n-wells NW1 and NW2 are arranged below the drain line 821, the gate line 822, and the source line 823. The n-wells NW1 and NW2 are respectively shaped as a letter C and surround the periphery of the circuit core area 110, as shown in FIG. 9B. P-doped areas PD1 and PD2 are arranged in the n-well NW1. P-doped areas PD3 and PD4 are arranged in the n-well NW2. The drain line 821 is electrically connected to the p-doped areas PD1 and PD3 below the drain line 821. The source line 823 is electrically connected to the p-doped areas PD2 and PD4 below the source line 823. The gate line 822 is located above the n-wells NW1 and NW2, between the p-doped areas PD1 and PD2, and between the p-doped areas PD3 and PD4.

The power transistor 730 can be an NMOS transistor in this embodiment. The second semiconductor element 830 (e.g., the power transistor 730) includes a drain line 831, a gate line 832, and a source line 833. The drain line 831, the gate line 832, and the source line 833 are arranged on the semiconductor substrate 805 and individually shaped as a ring and surround the periphery of the circuit core area 110, as shown in FIG. 9A. The gate line 832 is arranged between the source line 833 and the drain line 831. The drain line 831 is electrically connected to an output terminal LX. The source line 833 is electrically connected to a power rail VSS.

P-wells PW1 and PW2 are arranged below the drain line 831, the gate line 832, and the source line 833. The p-wells PW1 and PW2 are respectively shaped as a letter C and surround the periphery of the circuit core area 110, as shown in FIG. 9B. N-doped areas ND1 and ND2 are arranged in the p-well PW1. N-doped areas ND3 and ND4 are arranged in the p-well PW2. The drain line 831 is electrically connected to the n-doped areas ND1 and ND3 below the drain line 831. The source line 833 is electrically connected to the n-doped areas ND2 and ND4 below the source line 833. The gate line 832 is located above the p-wells PW1 and PW2, between the n-doped areas ND1 and ND2, and between the n-doped areas ND3 and ND4.

To sum up, it can be learned from FIG. 9A that the first semiconductor element 820 (e.g., the power transistor 720) and the second semiconductor element 830 (e.g., the power transistor 730) which surround the periphery of the circuit core area 110 have the large channel width, and therefore the first semiconductor element 820 and the second semiconductor element 830 can instantaneously and effectively transmit a significant amount of the transient current. The increase in the circuit core area 110 leads to the increase in the channel width of the first semiconductor element 820 and the second semiconductor element 830 and further leads to the improvement of the current transmission capability of the first semiconductor element 820 and the second semiconductor element 830. Hence, the first semiconductor element 820 (e.g., the power transistor 720) and the second semiconductor element 830 (e.g., the power transistor 730) of the power IC shown in FIG. 9A may effectively increase the amount of transmitted current. From another perspective, according to the embodiment shown in FIG. 9A, the first semiconductor element 820 (e.g., the power transistor 720) and the second semiconductor element 830 (e.g., the power transistor 730) which occupy the largest area are arranged on the periphery of the circuit core area 110, such that the first semiconductor element 820 and the second semiconductor element 830 surround the circuit core area 110 (e.g., the core circuit); as a result, the die size can be effectively reduced.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A semiconductor device comprising:
a semiconductor substrate having a circuit core area; and
a first semiconductor element arranged on the semiconductor substrate, the first semiconductor element at least partially surrounding a periphery of the circuit core area, wherein a layout area of the first semiconductor element is larger than a layout area of any of semiconductor elements in the circuit core area, wherein the any of the semiconductor elements in the circuit core area comprises:
a power pad, wherein the power pad is electrically connected to a first connection portion of the first semiconductor element; and
a signal pad.

2. The semiconductor device of claim 1, wherein the layout area of the first semiconductor element is at least twice the layout area of any of semiconductor elements in the circuit core area.

3. The semiconductor device of claim 1, wherein the first semiconductor element is a Zener diode or a power transistor.

4. The semiconductor device of claim 1, wherein the first semiconductor element is shaped as a letter C or a ring and surrounds the periphery of the circuit core area.

5. A semiconductor device, comprising:
a semiconductor substrate having a circuit core area; and
a first semiconductor element arranged on the semiconductor substrate, the first semiconductor element at least partially surrounding a periphery of the circuit core area, wherein a layout area of the first semiconductor element is larger than a layout area of any of semiconductor elements in the circuit core area,
wherein the first semiconductor element comprises:
a first-electrode line arranged on the semiconductor substrate and shaped as a letter C or a ring, the first-electrode line at least partially surrounding the periphery of the circuit core area, wherein a first connection portion of the first-electrode line is electrically connected to a first power pad via a power rail;
a second-electrode ring arranged on the semiconductor substrate, the second-electrode ring at least partially surrounding the periphery of the circuit core area, wherein a second connection portion of the second-electrode ring is electrically connected to a second power pad; and
a second-electrode line arranged on the semiconductor substrate and shaped as a letter L, the letter C, or a ring, the second-electrode line surrounding the periphery of the circuit core area, wherein the second-electrode line is electrically connected to the second power pad, and the first-electrode line is arranged between the second-electrode ring and the second-electrode line.

6. The semiconductor device of claim 1, wherein the any of the semiconductor elements in the circuit core area comprises a diode or a driving controller.

7. A semiconductor device, comprising:
a semiconductor substrate having a circuit core area; and
a first semiconductor element arranged on the semiconductor substrate, the first semiconductor element at least partially surrounding a periphery of the circuit core area, wherein a layout area of the first semiconductor element is larger than a layout area of any of semiconductor elements in the circuit core area,
wherein the any of the semiconductor elements in the circuit core area comprises:
a first power pad arranged above the semiconductor substrate and located in the circuit core area, wherein the first power pad is electrically connected to a first connection portion of the first semiconductor element via a power rail;
a second power pad arranged above the semiconductor substrate and located on an edge portion of the circuit core area, wherein the second power pad is electrically connected to a second connection portion of the first semiconductor element;
a signal pad arranged above the semiconductor substrate and located in the circuit core area;
a first diode arranged in the circuit core area and located between the first power pad and the signal pad, wherein a first terminal of the first diode is electrically connected to the first power pad, and a second terminal of the first diode is electrically connected to the signal pad; and a second diode arranged in the circuit core area and located between a third connection portion of the first semiconductor element and the signal pad, wherein a first terminal of the second diode is electrically connected to the signal pad, and a second terminal of the second diode is electrically connected to the third connection portion of the first semiconductor element.

8. The semiconductor device of claim 7, wherein the first diode comprises:

a plurality of first electrodes acting as the first terminal of the first diode, the first electrodes being electrically connected to the first power pad; and a plurality of second electrodes acting as the second terminal of the first diode, the second electrodes being electrically connected to the signal pad, wherein the first electrodes and the second electrodes are alternately arranged as fingers.

9. The semiconductor device of claim 7, wherein the third connection portion of the first semiconductor element is electrically connected to the second connection portion of the first semiconductor element via a metal conductive wire.

10. The semiconductor device of claim 1, wherein the power pad is arranged above the semiconductor substrate and located in the circuit core area, the signal pad is arranged above the semiconductor substrate and located in the circuit core area and between the first semiconductor element and the power pad, and the any of the semiconductor elements in the circuit core area further comprises:

a first diode arranged in the circuit core area and located between the power pad and the signal pad, wherein a first terminal of the first diode is electrically connected to the power pad, and a second terminal of the first diode is electrically connected to the signal pad; and a second diode arranged in the circuit core area and located between a second connection portion of the first semiconductor element and the signal pad, wherein a first terminal of the second diode is electrically connected to the signal pad, and a second terminal of the second diode is electrically connected to the second connection portion of the first semiconductor element.

11. The semiconductor device of claim 10, wherein the first diode comprises:

a first electrode acting as the first terminal of the first diode, the first electrode being electrically connected to the power pad; and a second electrode acting as the second terminal of the first diode, the second electrode being electrically connected to the signal pad, wherein the second electrode is shaped as a letter C and surrounds a periphery of the first electrode.

12. The semiconductor device of claim 1, further comprising:

a second semiconductor element arranged on the semiconductor substrate, the second semiconductor element surrounding the periphery of the circuit core area, wherein a layout area of the second semiconductor device is larger than the layout area of any of semiconductor devices in the circuit core area.

13. The semiconductor device of claim 12, wherein the second semiconductor element is a Zener diode or a power transistor.

14. The semiconductor device of claim 12, wherein the first semiconductor element and the second semiconductor element are respectively shaped as a letter C and surround the periphery of the circuit core area.

15. The semiconductor device of claim 12, wherein the second semiconductor element comprises:

a gate line arranged on the semiconductor substrate and shaped as a letter C or a ring, the gate line surrounding the periphery of the circuit core area;

a source line arranged on the semiconductor substrate and shaped as the letter C or a ring, the source line surrounding the periphery of the circuit core area; and a drain line arranged on the semiconductor substrate and shaped as the letter C or a ring, the drain line surrounding the periphery of the circuit core area, wherein the gate line is located between the source line and the drain line.

* * * * *